US005949033A

United States Patent [19]

Anagnos

[11] Patent Number: 5,949,033

[45] Date of Patent: Sep. 7, 1999

[54] CONSTRAINED LAYER DAMPED LOUDSPEAKER ENCLOSURE

[75] Inventor: Daniel P. Anagnos, Grandview, N.Y.

[73] Assignees: Sony Corporation, Tokyo, Japan; Sony Electronics, Inc., Park Ridge, N.J.

[21] Appl. No.: 08/741,014

[22] Filed: Oct. 30, 1996

[51] Int. Cl.$^{6}$ .............................. H05K 5/00; A47B 81/06

[52] U.S. Cl. .......................... 181/148; 181/151; 181/156; 181/199

[58] Field of Search .................................... 181/144, 145, 181/146, 147, 148, 151, 156, 199

[56] References Cited

U.S. PATENT DOCUMENTS

| | | | |
|---|---|---|---|
| 3,412,824 | 11/1968 | Armstrong | 181/151 |
| 3,652,360 | 3/1972 | Hartman et al. | 181/199 |
| 4,624,338 | 11/1986 | Ewald | 181/148 |
| 4,869,340 | 9/1989 | Coudoux | 181/146 |
| 5,115,884 | 5/1992 | Falco | 181/156 |
| 5,218,176 | 6/1993 | Meyer, Jr. | 181/199 |
| 5,519,178 | 5/1996 | Ritto et al. | 181/199 |
| 5,602,367 | 2/1997 | Meyer | 181/156 |
| 5,731,555 | 3/1998 | Anagnos | 181/199 |

OTHER PUBLICATIONS

"Technical Design Concepts and Philosophy of the SS–M9 Loudspeaker", Sony Electronics Inc., 1 Sony Drive, Park Ridge, New Jersey 07656; 1994.

Sony, "Technical Design Concepts and Philosophy of the SS–M9 Loudspeaker", 1994, pp. 3–7.

TEAC Manual, "The Sierra Series," ST–X5, TEAC Corporation of America, 7733 Telegraph Road, Montebello, CA 90640 (no date).

Sorbothane Manual, "The Ultimate Damping & Isolation Material," Sorbothane Inc., 2144 State Route 59, Kent, OH 44240, Jun. 1995.

E.A.R. Speciality Composites Manual, "ISOLOSS Shock and Vibration Mounts." (no date).

E.A.R. Technical Data Sheet TDS–11, Division, Cabot Safety Corporation, Delaware Industrial Park, Newark, DE 19713 (no date).

E.A.R. Technical Data Sheet TDS–15. (no date).

E.A.R. Technical Data Sheet TDS–19. (no date).

E.A.R. Technical Data Sheet TDS–47. (no date).

E.A.R., Vibration and Shock Control Seminar, "Improving Your Product Thru Vibration And Shock Control," Presented By Brian J. Joyal, Acoustical Engineer. (no date).

Bostik Manual, Product Data: Bostik 7132/Boscodur #4, Bostik Chemical Group, Middleton, MA 01949, Sep. 1983.

*Primary Examiner*—Eddie C. Lee
*Attorney, Agent, or Firm*—Ronald P. Kananen; Rader, Fishman & Grauer

[57] ABSTRACT

A loudspeaker enclosure having a constrained layer damping system for minimizing the propagation of vibrations and controlling the resonant modes of the enclosure. The enclosure has a front baffle board on which a plurality of transducers are mounted, and a plurality of other walls mounted to the baffle board to form a cabinet structure. The front baffle board comprises an interior substrate, an exterior substrate, and a constrained layer damping material sandwiched between and bonded to the two substrates. The constrained layer damping material comprises an energy absorbing thermoplastic alloy having a very high material loss factor. The other walls of the enclosure also comprise an interior substrate and an exterior substrate with a constrained layer damping material sandwiched therebetween. An extensional damping material may also be bonded to an interior surface of the interior substrates to further control vibrations in the enclosure.

19 Claims, 5 Drawing Sheets

CONSTRAINED LAYER DAMPED LOUDSPEAKER ENCLOSURE

BACKGROUND OF THE INVENTION

1. Field of the Invention

The present invention relates generally to arrangements for minimizing the propagation of vibrational energy and resonant mode behavior and, in particular, to a loudspeaker enclosure having a constrained layer damping system for minimizing the propagation of vibrations and controlling the resonant modes of the enclosure.

2. Description of the Relevant Art

A loudspeaker operates by converting electrical energy into vibrational (sound) energy using one or more transducers. Transducers transmit vibrational energy through their frame, which is usually made of metal or plastic, into the walls of the loudspeaker cabinet. This energy will propagate freely throughout the cabinet, exciting panel resonances (i.e., the energy is amplified at specific frequencies) and then reradiate into the air. This re-radiation of energy is undesirable because it can be perceived as distortion and coloration of the primary signal in the frequency range of 200 Hz to 1 kHz. In addition, these re-radiation points or resonant modes act as undesired phantom sound sources, compromising the sound field imaging capabilities of the loudspeaker.

Several approaches have been taken by manufacturers to address this problem, including: (1) decoupling the transducer from the cabinet front baffle by using a "soft" mounting system; (2) adding internal bracing and otherwise increasing wall rigidity to increase the frequency of panel resonant modes; (3) adding extensional damping materials and compounds to the interior surfaces of the cabinet walls to damp vibrational energy; and (4) casting the front baffle from concrete or similar energy absorbing material.

Decoupling the transducer from the cabinet is an undesirable approach because it prevents the transducer from utilizing the overall mass of the loudspeaker cabinet to minimize unwanted motion of the transducer frame. If the transducer is decoupled from the cabinet, there will be relative movement between the transducer frame and the cabinet, resulting in a loss in perceived fidelity. This loss of perceived fidelity is particularly noticeable in the low level detail of the reproduced sound.

The addition of internal bracing and stiffening of the cabinet walls is a desirable solution because it pushes the panel resonant modes to higher frequencies where they cause less audible damage. Unfortunately, this method alone is not enough—the resonant modes still exist at higher frequencies.

The addition of extensional damping materials or compounds to the interior walls of the cabinet also improves performance of the speaker, provided that the extensional damping material applied actually works. In most cases, the extensional damping material used is not effective, except for damping small amounts of high frequency vibration. The thickness and composition of the extensional damping material used is critical in determining its effectiveness. It is also critical that at least 50% of the surface area of the interior walls be covered for the extensional damping material to be effective.

Casting a front baffle of the loudspeaker from an acoustically "dead" material, such as concrete, offers an effective solution, but not without its own set of problems. Such an approach must deal with the complication of how to attach such a heavy and massive baffle to the rest of the loudspeaker cabinet without compromising the mechanical integrity of the overall structure. Moreover, the heavy baffle usually requires attachment using gaskets and screws in order to keep the enclosure airtight and, thus, cannot maintain the mechanical rigidity of the baffle. In any case, this approach still does not address the damping of the rest of the loudspeaker cabinet walls.

SUMMARY OF THE INVENTION

It is an object of the present invention to provide a loudspeaker enclosure having a construction that minimizes propagation of vibrational energy through the walls of the enclosure and effectively damps the resonant modes of the enclosure.

It is a further object of the present invention to provide a loudspeaker enclosure that minimizes unwanted motion of the transducer frame, minimizes both high and low frequency resonant modes of the loudspeaker enclosure, does not require a heavy and massive baffle or otherwise compromise the mechanical integrity of the loudspeaker, and maintains the mechanical rigidity of the baffle.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

The present invention applies an optimized constrained layer damping technique to a loudspeaker enclosure to increase the rigidity and mass of the walls of the enclosure, as well as to maximize the damping of vibrational energy from very low frequencies (e.g., below 100 Hz) to relatively high frequencies (e.g., above 20 kHz).

In order to achieve the objects set forth above, the present invention comprises a loudspeaker enclosure, comprising a baffle board having at least one opening for mounting a transducer, and a plurality of walls connected to the baffle board which together with the baffle board define an enclosure. The baffle board comprises a constrained layer damping arrangement having a first substrate, a second substrate, and a layer of damping material sandwiched between and bonded to the first and second substrates. The damping material comprises an energy absorbing thermoplastic alloy having a high material loss factor.

In the preferred embodiment, the layer of damping material has a thickness in the range of 3.2 mm to 6.4 mm. The first and second substrates are bonded to the layer of damping material using a two-part adhesive suitable for bonding PVC films to porous fiberboard. The first and second substrates each comprises a pair of panels of medium density fiberboard bonded together with a layer of adhesive. A gasket is sandwiched between a mounting frame of the transducer and the baffle board for providing an airtight seal between the transducer and the baffle board. An extensional damping material may be bonded to the first substrate on an interior side of the baffle board.

It is also preferred that the other walls of the enclosure comprise a constrained layer damping arrangement having an interior substrate, an exterior substrate, and a layer of damping material sandwiched between and bonded to the interior and exterior substrates. The constrained layer damping arrangement of the other walls is generally the same as the front baffle board, except that a combined thickness of the substrates of the front baffle board is preferably greater than a combined thickness of the substrates of the other walls of the enclosure.

In a further aspect of the present invention, in order to achieve the objects set forth above, the invention comprises a loudspeaker having a constrained layer damped enclosure. The loudspeaker comprises a baffle board and a plurality of transducers mounted to the baffle board. A plurality of walls are connected to the baffle board which together with the baffle board define the enclosure of the loudspeaker. A plurality of internal braces extend between the baffle board and the walls of the enclosure for stiffening the walls and the baffle board to increase a resonance frequency of the enclosure. The baffle board comprises a constrained layer damping arrangement having a first substrate, a second substrate, and a layer of damping material sandwiched between and bonded to the first and second substrates. The damping material comprises an energy absorbing thermoplastic alloy having a high material loss factor.

BRIEF DESCRIPTION OF THE DRAWINGS

The various features and advantages of the present invention will become more clearly appreciated as a description is made with reference to the appended drawings. In the drawings.

DETAILED DESCRIPTION OF THE INVENTION

Preferred embodiments of the present invention will be described below by making reference to FIGS. 1 to 7 of the drawings.

Figure 1:
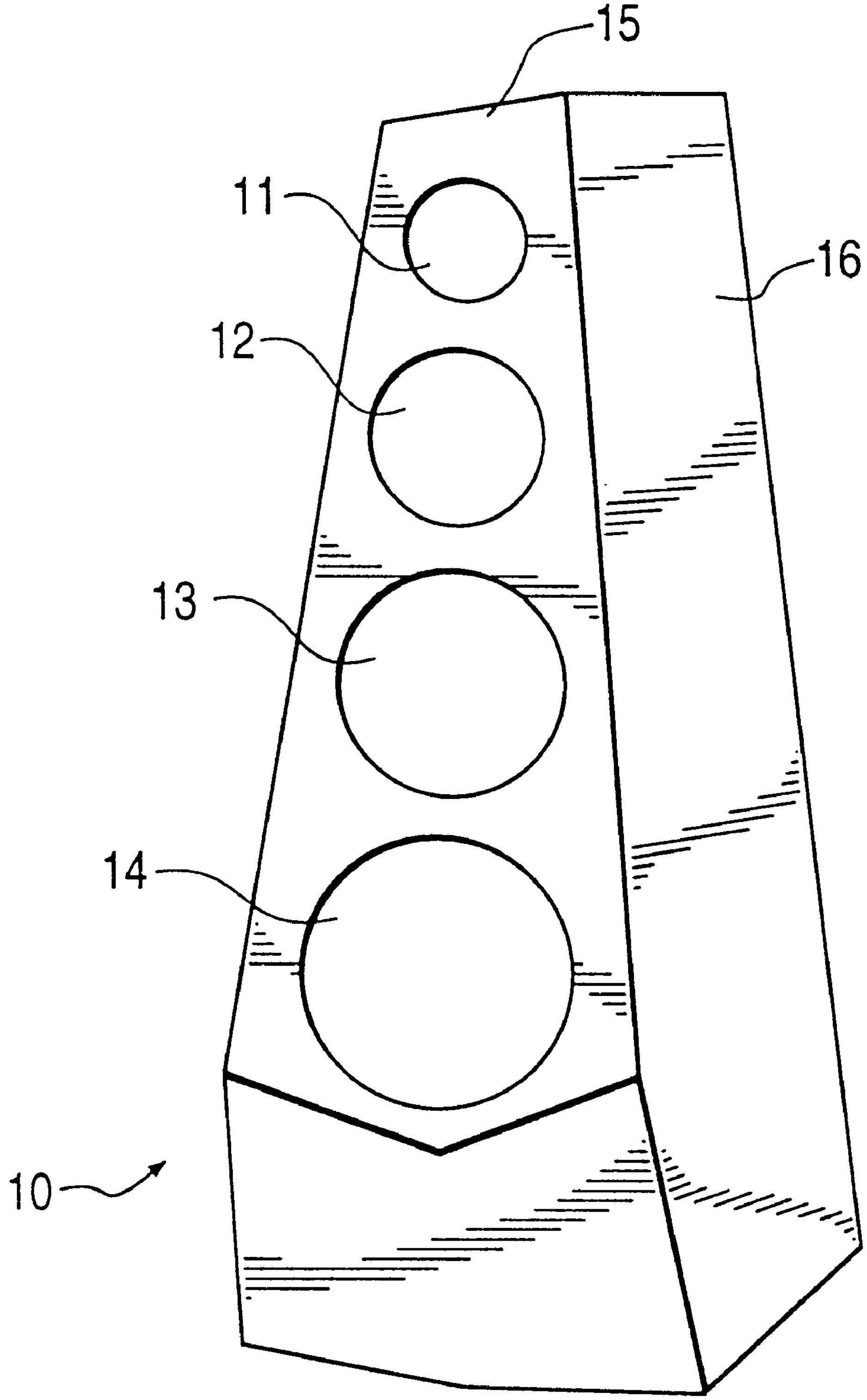
FIG. 1 is a perspective view of a loudspeaker equipped with a constrained layer damping system according to the present invention.

The present invention was developed for use in a high performance loudspeaker, such as the loudspeaker 10 shown in FIG. 1. The loudspeaker 10 includes a plurality of speaker transducers 11, 12, 13, 14 (e.g., tweeter, midrange, woofer, and subwoofer, respectively). The speaker transducers are mounted to a baffle board 15 of a speaker cabinet. The speaker cabinet has side walls 16, a rear wall 17, and top and bottom walls 18, 19 so as to form an airtight enclosure. Various other electrical components (e.g., crossover networks) are mounted within the speaker cabinet.

Figure 2:
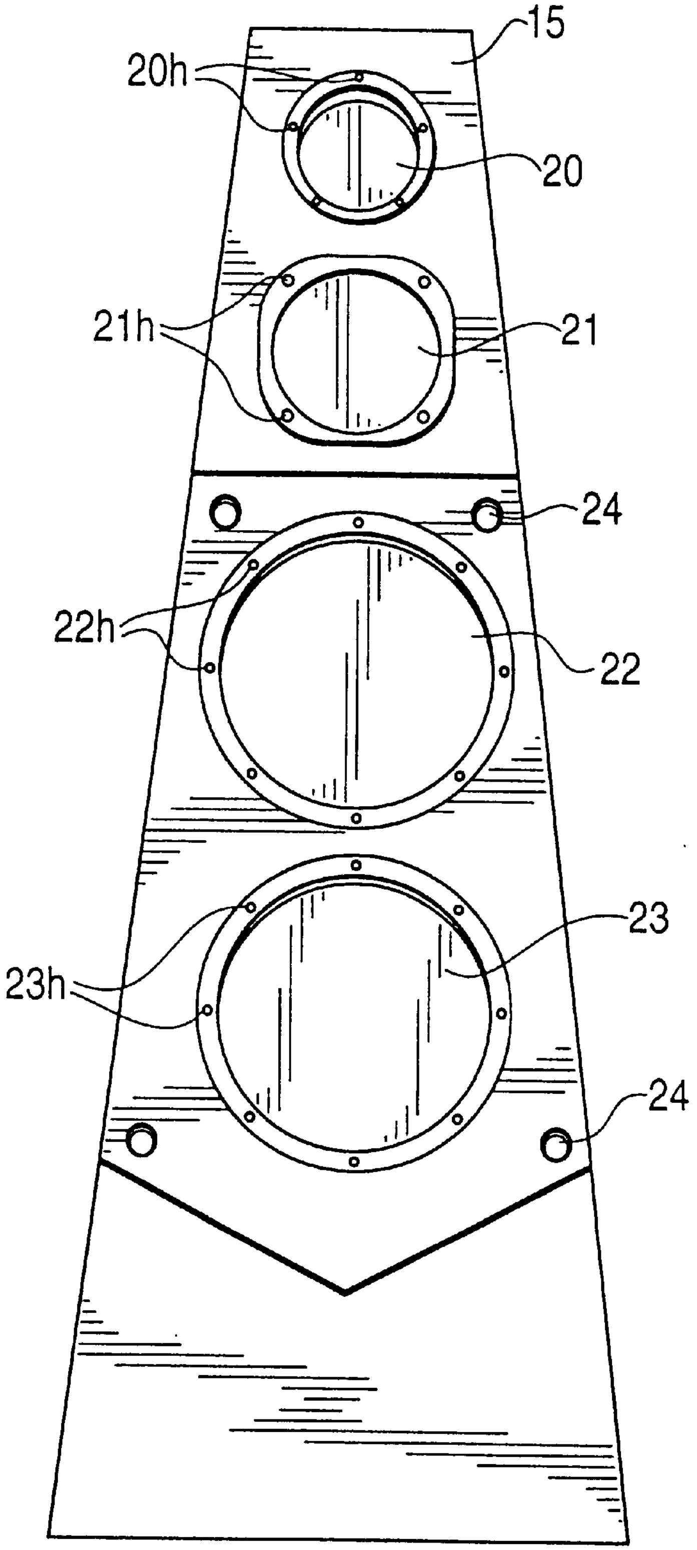
FIG. 2 is a front view of the baffle board of the loudspeaker of FIG. 1.

FIG. 2 provides a front view of the loudspeaker baffle board 15 with the transducers 11, 12, 13, 14 removed. As shown, the baffle board 15 has an opening 20 for the first transducer 11, an opening 21 for the second transducer 12, an opening 22 for the third transducer 13, and an opening 23 for the fourth transducer 14. Each of the openings 20, 21, 22, 23 have a plurality of mounting holes 20*h*, 21*h*, 22*h*, 23*h*, respectively, spaced about a circumference thereof for securing the transducers 11, 12, 13, 14 to the baffle board 15. A plurality of blind holes 24 are provided in the baffle board 15 for securing a protective grill (not shown) over the front face of the baffle board 15.

Figure 3:
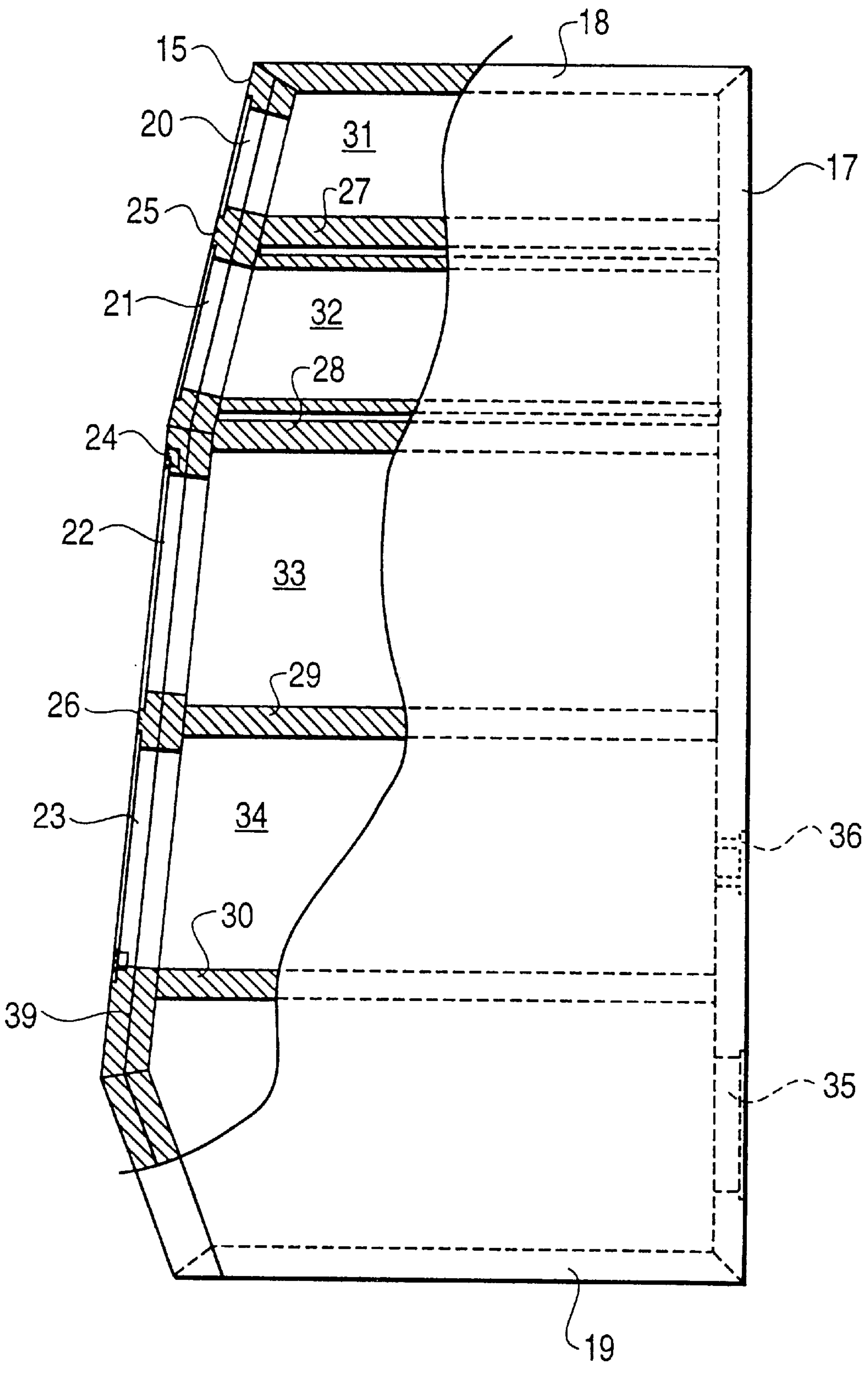
FIG. 3 is a side view in partial section of a loudspeaker enclosure having a constrained layer damping arrangement according to the present invention.
Figure 4A:
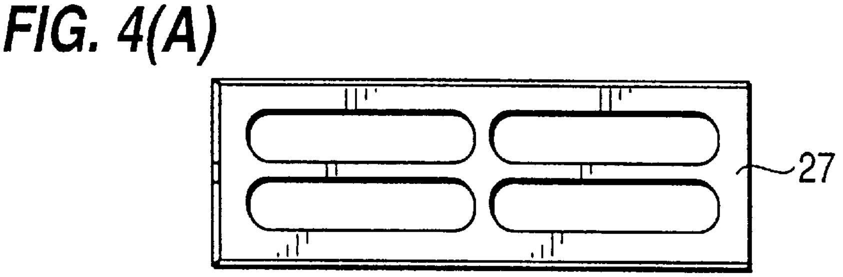
FIGS. 4(A) through 4(D) are plan views of reinforcement braces positioned in the loudspeaker enclosure of FIG. 3 for increasing the rigidity of the walls of the enclosure.
Figure 4B:
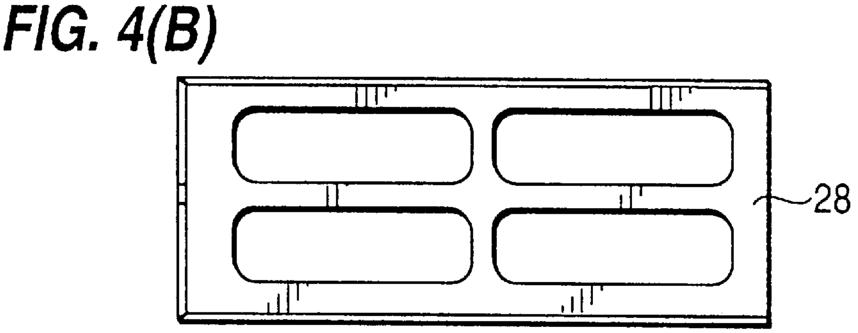
Figure 4C:
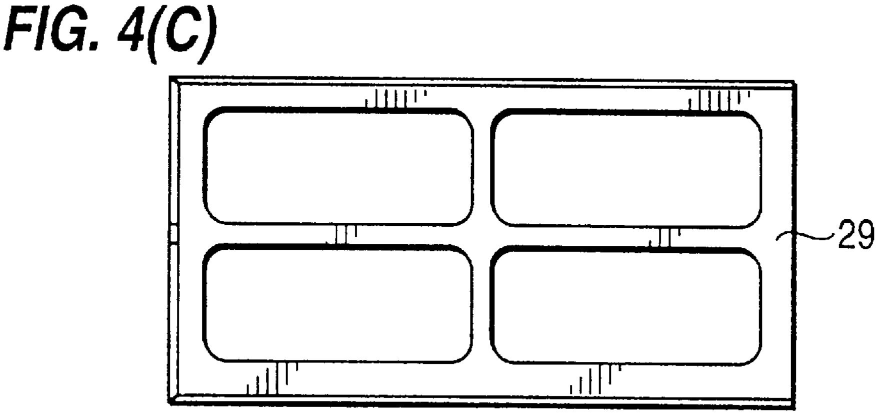
Figure 4D:
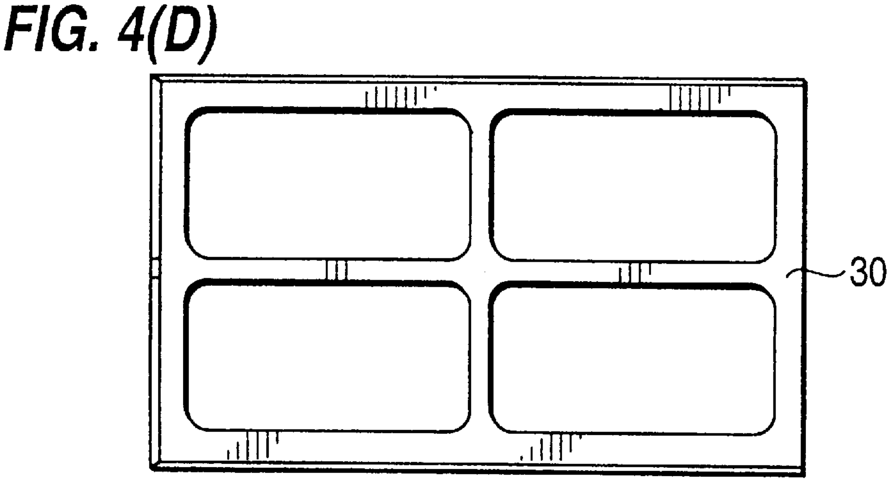

FIG. 3 provides a side view in partial section of the loudspeaker enclosure. As seen in FIG. 3, the top portion 25 of the baffle board 15 is angled slightly rearwardly with respect to the bottom portion 26 of the baffle board 15. A plurality of braces 27, 28, 29, 30 extend between a rear wall 17 of the enclosure and the baffle board 15, and are also secured to the side walls 16 of the enclosure. The braces 27, 28, 29, 30 are provided to increase the structural rigidity of the loudspeaker enclosure.

A first chamber 31 is formed in the top of the enclosure behind the opening 20 for the first transducer 11 (i.e., the tweeter). A second chamber 32 is formed behind the opening 21 for the second transducer 12 (i.e., the midrange). The interior of the second chamber 32 for the midrange transducer 12 is sealed from the rest of the loudspeaker enclosure to minimize acoustic distortion. The first chamber 31 is preferably open to the lower portion of the enclosure.

The lower portion of the loudspeaker enclosure, including third and fourth chambers 33, 34 behind the third and fourth transducers 13, 14, respectively (i.e., the woofer and subwoofer transducers, respectively), is vented through one or more port holes 35 through the rear wall 17 of the enclosure. The braces 29, 30 in the lower portion of the enclosure are open to permit air ventilation from the chambers 33, 34 behind the third and fourth transducers 13, 14 through the port hole 35. A terminal 36 is mounted in the rear wall 17 of the enclosure to provide an electrical connection to the loudspeaker 10.

As shown in FIGS. 4(A) through 4(D), the braces 27, 28, 29, 30 extending between the baffle board 15 and the rear wall 17 of the loudspeaker enclosure each have an open construction to permit controlled air flow within the enclosure. The overall shape of the loudspeaker enclosure and the design of the braces 27, 28, 29, 30 are not critical to the present invention and may be altered to suit particular applications.

The present invention provides an optimized constrained layer damping arrangement for the walls of the loudspeaker enclosure. The constrained layer damping arrangement according to the invention functions to increase the rigidity and mass of the walls of the enclosure, as well as to maximize the damping of vibrational energy from very low frequencies (e.g., below 100 Hz) to relatively high frequencies (e.g., above 20 kHz). The details of the construction of the cabinet walls are described below.

Figure 5:
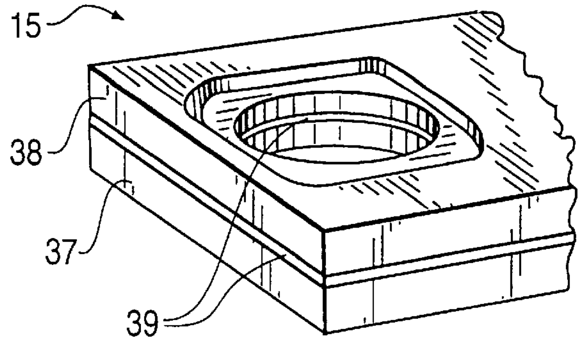
FIG. 5 is a perspective view of a baffle board having a constrained layer damping arrangement according to the present invention.

FIG. 5 provides a perspective view of a baffle board 15 having a constrained layer damping arrangement according to the present invention. The baffle board 15 comprises an interior substrate 37, an exterior substrate 38, and a constrained layer damping material 39 sandwiched between and bonded to the two substrates 37, 38. The constrained layer damping material 39 comprises a very high loss factor thermoplastic (described below). The other walls 16, 17, 18, 19 of the cabinet also comprise an interior substrate and an exterior substrate with a constrained layer damping material sandwiched therebetween.

Figure 6:
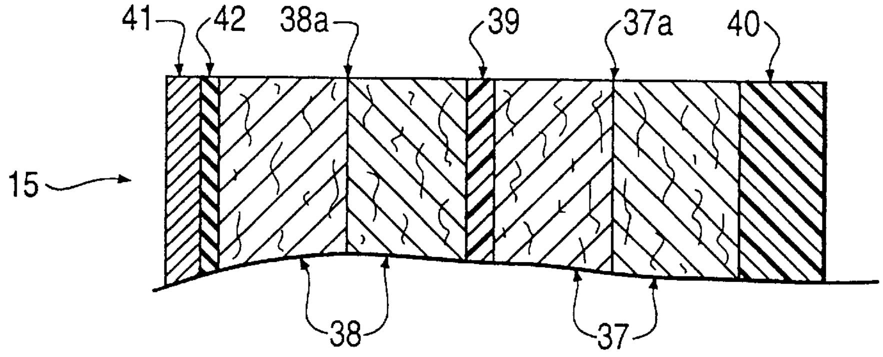
FIG. 6 is a cross-sectional view of a constrained layer damped baffle board according to the present invention.
Figure 7:
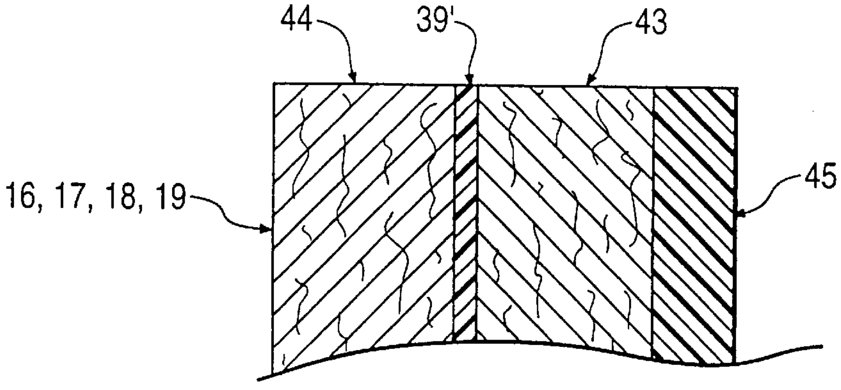
FIG. 7 is a cross-sectional view of the other walls of a loudspeaker enclosure having a constrained layer damping arrangement according to the present invention.

FIG. 6 provides a cross-sectional view of the construction details for the front baffle board 15 according to the present invention, and FIG. 7 provides a cross-sectional view of the construction details for the other walls 16, 17, 18, 19 of the loudspeaker enclosure.

Referring to FIG. 6, the details of the construction of the front baffle board 15 will be described first. The front baffle board 15 is the most sensitive part of the loudspeaker enclosure since it is in direct contact with the transducers 11, 12, 13, 14. Thus, the front baffle board 15 requires a slightly different construction for optimization according to the present invention. The thickness and composition of all of the materials in the baffle board 15 are optimized for maximum effectiveness over a specific frequency range.

The front baffle board 15 is divided into two separate interior and exterior substrates 37, 38, bonded to a specially designed constrained layer damping material 39 at the center. Each substrate 37, 38 is in turn composed of two panels of medium density fiberboard (MDF) of between 19 mm and 25 mm thickness, bonded together with a layer 37*a*, 38*a* of PVC-type wood glue, for example. The bond 37*a*, 38*a* is preferably stronger than the substrates 37, 38 themselves so as not to compromise the structural integrity of the enclosure.

The interior and exterior substrates 37, 38, which are each 38 mm to 50 mm thick, are bonded to the constrained layer damping material 39 using a two-part adhesive system (described below) specifically developed for use in vacuum form bonding of PVC films to porous fiberboard. All bonding is done under high pressure conditions.

The constrained layer damping material 39 is an extremely high loss factor thermoplastic, temperature-tuned for optimal performance at 55 to 105° F. The thickness of the layer 39 varies depending upon the frequency range optimized. For example, a thickness of 3.2 mm is preferred for a frequency range of 100 Hz to 20 kHz, while a thickness of 6.4 mm is preferred for a frequency range of 20 Hz to 10 kHz.

An extensional damping material 40 (described below) is bonded to the interior substrate. Also, as shown in FIG. 6, a mounting frame 41 of each of the transducers 11, 12, 13, 14 is secured to the baffle board 15 with a gasket 42 placed between the mounting frame 41 and the exterior substrate 38. The gasket 42 provides an airtight seal between the exterior substrate 38 and the mounting frame 41, but is not so soft that it completely decouples the transducer 11, 12, 13, 14 from the baffle board 15.

As shown in FIG. 7, the other cabinet walls 16, 17, 18, 19 utilize generally the same constrained layer damping material 39' and bonding techniques, but employ interior and exterior substrates 43, 44 that are thinner than the composite substrates used in the front baffle board 15. For example, the interior and exterior substrates 43, 44 of the other walls 16, 17, 18, 19 may be about 25 mm thick MDF. It is preferred that the thickness of each substrate 43, 44 be at least 25 mm in order to achieve maximum effectiveness. In general, thicker substrates offer superior performance. A layer of extensional damping material 45 may also be bonded to the interior substrate 43.

While it is possible to use multiple constrained damping material layers in the baffle board 15 and walls 16, 17, 18, 19 of the enclosure, it has been discovered that using multiple constrained layers generally does not increase the effectiveness over the single layer arrangements shown in FIGS. 6 and 7. It has also been discovered that the addition of the extensional damping material to an optimal constrained layer damped design does not generally increase the effectiveness, other than adding additional mass to the interior substrate. Thus, the front baffle board 15 and the other walls 16, 17, 18, 19 can be formed without the layer of extensional damping material 40, 45. However, if less than optimal thickness substrates and constrained layer damping materials 39, 39' are utilized, the additional layer of extensional damping material 40, 45 will provide a beneficial effect.

The net result of the constrained layer damping material arrangement of the present invention is that the cabinet walls constructed as described above are extremely rigid and highly damped. All resonant modes are high in frequency and very low in amplitude, and therefore, much easier to damp. In addition, all resonant modes decay very rapidly in time. The effectiveness of this solution is far greater than what is possible using extensional damping techniques alone. The combination of the constrained layer damping design set forth in this disclosure with proper loudspeaker bracing techniques yields nearly ideal loudspeaker enclosure characteristics in terms of resonant mode behavior.

Suitable constrained layer damping materials that meet the requirements outlined above are produced by E-A-R Specialty Composites, a division of Cabot Safety Corporation, and are sold under the proprietary name ISODAMP® C-1000 SERIES ISOLATION MATERIALS (Product Nos. C1OO2-12 and C1OO2-25). These materials are composed of energy absorbing thermoplastic alloys having very high material loss factors. The high internal damping of these materials reduces mechanically or acoustically induced vibrations and dissipates shock and impact energy at a rapid rate. These properties, in conjunction with high physical strength, flexibility, environmental resistance, anti-skid properties and good flame resistance, make these materials suitable for constrained layer damping applications. The following Table 1 provides a listing of acceptable physical and strength properties for the constrained layer damping materials according to the preferred embodiment.

TABLE 1

PROPERTIES OF CONSTRAINED LAYER DAMPING MATERIAL

| PROPERTY | TEST METHOD | TEST RESULT |
|---|---|---|
| Specific Gravity | ASTM D792 | 1.289 |
| Glass Transition, Tg | ASTM E756 | −20° C. |
| Hardness | ASTM D2240 Shore A durometer 15 sec. post impact @ 23° C. | 56 |
| Rebound | ASTM D2632 (Modified) Bashore Resilience % Rebound (First) Min. Rebound Temp. | 4.8% 21° C. |
| Outgassing | ASTM E595 (Modified) 24 hr. at $10^{-6}$ Torr Total Mass Loss Water Reabsorbed | 0.067% @40° 0.043% |
| Dielectric Strength | ASTM D149 Breakdown Voltage | 166 volts/mil |
| Thermal Conductivity | ASTM C177 BTU in./hr. $ft^2$ ° F. | 1.00 |
| Coefficient of Friction | ASTM D3389 on Etched Aluminum | |
| | Static | .92 |
| | Kinetic | .75 |
| Compressive Deformation | ASTM D621 Method B 24° C. | |
| | % Deformation (3 hr.) | 10.4% |
| | % Recovery (1.5 hr.) | 90.4% |

TABLE 1-continued

PROPERTIES OF CONSTRAINED LAYER DAMPING MATERIAL

| PROPERTY | TEST METHOD | TEST RESULT |
|---|---|---|
| Compression Set | ASTM D395 Method B | |
| | 22 hr. at 22° C. (72° F.) | 14% |
| | 22 hr. at 80° C. (176° F.) | 62% |
| Tensile Strength | ASTM D903 | 1574 psi |
| Elongation | ASTM D903 | 459% |
| Tensile Modulus | ASTM D903 | 450 psi |
| Tear Strength | ASTM D1004 0.125" Samples | 25.2 lb. |
| Abrasion Resistance | ASTM D3389 H22 stone, 1000 g load Wear Factor | 242 |

The constrained layer damping material also has excellent resistance to adverse environmental conditions, such as ozone, ultraviolet radiation, and chemicals. The damping material is best utilized without any pressure sensitive adhesive.

An ideal glue material for bonding the damping material to the substrates is a two part adhesive system available from Bostik Chemical Group, a division of USM Corporation, under the proprietary name BOSTIK® (Product Nos. Bostik 7132/Boscodur #4). This bonding material is a spray viscosity vacuum forming adhesive designed for vacuum form bonding of PVC films to wood, fiberboards, and other porous substrates. The following Table 2 provides a listing of acceptable properties for the bonding material according to the preferred embodiment.

TABLE 2

PROPERTIES OF BONDING MATERIAL

| PROPERTY | PART A (BOSTIK 7132) | PART B (BOSCDUR #4) |
|---|---|---|
| Base | Linear Saturated Polyester | Polyisocyanate |
| % Total Solids (approx.) | 25.5% ± 1 | 69% |
| Viscosity (Brookfield) | 85 cps | Thin Liquid |
| Lbs./Gal. (kg/liter) | 7.74 (0.9) | 8.99 (1.08) |
| Flash Point (S.C.C.) | 14° F (−10° C.) | 29° F. (−2° C.) |
| Solvent System | M.E.K. Blend | M.E.K. |
| Mixing Ratio (variable) | 20–24 volumes | 1 volume |

As mentioned above, the substrates are preferably medium density fiberboard (MDF), bonded when necessary with standard PVC-type wood glue. All bonding operations should be done under high pressure conditions using a large press prior to any cutting or machining operations by the cabinet maker. It is important that the glue be spread evenly and consistently over all surfaces, and that sufficient pressure and curing duration be allowed so that the bonding is completely effective. Due to the large overall thickness of the final panels, it will be necessary to machine each part to very close tolerances using CNC equipment. Once the individual panels are fabricated, cabinet assembly can proceed in a conventional manner.

A variation of the present invention can be made wherein only the front baffle board 15 of the loudspeaker enclosure utilizes a constrained layer damping arrangement. Also, the interior and exterior substrates 37, 38 of the front baffle board 15 can be composed of a single layer of 19.1 mm MDF, for example, instead of the multiple bonded layers described above for the preferred embodiment. The damping material for the constrained layer 39, 39' may have different thicknesses than that described above for the preferred embodiment.

As mentioned above, in cases where a non-ideal substrate or damping material thickness must be used, or in the absence of constrained layer damping, the addition of an extensional damping material layer 40, 45 may be beneficial. An ideal extensional damping material for this purpose is a single pass extruded, high temperature fused, thermoplastic alloy damping material. A suitable material is produced by E-A-R Specialty Composites, a division of Cabot Safety Corporation, under the proprietary name ISODAMP® CN VIBRATION DAMPING MATERIALS. A thickness of about 14.7 mm for the extensional damping material is preferred. However, thicknesses as low as 3.1 mm can also be effective. The extensional damping material should be bonded to the interior substrate 37, 43 using a two-part urethane or epoxy adhesive under high pressure (e.g., using a press).

Another material that can be used as the extensional damping material is a thermoset, polyether-based damping material. A suitable material is manufactured by Sorbothane Inc. under the proprietary name SORBOTHANE®. This material is preferably about 3.2 mm thick, has a durometer 30 hardness and a PSA backing. The material has a high degree of pliability that allows it to conform easily over any surface discontinuities and eliminates the need for a high pressure press.

The exact compositions of the loudspeaker cabinet wall substrates (interior and exterior) are not critical, provided that they are of sufficient thickness, mass and rigidity. Molded or fabricated polymers, metals, woods, and other composites can work quite well as substrates.

Though this invention refers specifically to the application of an optimized constrained layer damping construction to loudspeaker cabinet walls, such an arrangement could be applied to any situation in which the propagation of vibrational energy and resonant mode behavior must be minimized. For example, other uses of the constrained layer damping arrangement of the present invention may include electronics enclosures, sensitive optical or laser-based systems, automotive areas, and so forth.

It will be appreciated that the present invention is not limited to the exact construction that has been described above and illustrated in the accompanying drawings, and that various modifications and changes can be made without departing from the scope and spirit thereof. It is intended that the scope of the invention only be limited by the appended claims.

The invention claimed is:

1. A loudspeaker enclosure, comprising:

a baffle board having at least one opening for mounting a transducer;

a plurality of walls connected to said baffle board which together with said baffle board define an enclosure;

said baffle board comprising a constrained layer damping arrangement having a first substrate, a second substrate, and a layer of isolation material sandwiched between and bonded to said first and second substrates;

wherein said isolation material comprises an energy absorbing thermoplastic alloy having a high material loss factor.

2. The loudspeaker enclosure according to claim 1, wherein said layer of isolation material has a thickness in the range of 3.2 mm to 6.4 mm.

3. The loudspeaker enclosure according to claim 1, wherein said first and second substrates are bonded to said layer of isolation material using a two-part adhesive suitable for bonding PVC films to porous fiberboard.

4. The loudspeaker enclosure according to claim 1, wherein said first and second substrates each comprises a pair of panels of medium density fiberboard bonded together with a layer of adhesive.

5. The loudspeaker enclosure according to claim 1, further comprising at least one transducer secured to said baffle board, said transducer having a mounting frame with a mounting surface extending about a circumference of said at least one opening in the baffle board, and a gasket sandwiched between said mounting surface and said baffle board for providing an airtight seal between the transducer and the baffle board.

6. The loudspeaker enclosure according to claim 1, further comprising a layer of extensional damping material bonded to said first substrate on an interior side of said baffle board.

7. The loudspeaker enclosure according to claim 1, wherein said plurality of walls each comprises an interior substrate, an exterior substrate, and a layer of isolation material sandwiched between and bonded to said interior and exterior substrates.

8. The loudspeaker enclosure according to claim 7, wherein the isolation material in said plurality of walls comprises an energy absorbing thermoplastic alloy having a high material loss factor.

9. The loudspeaker enclosure according to claim 7, further comprising a layer of extensional damping material bonded to said interior substrate on an interior side of each of said plurality of walls.

10. The loudspeaker enclosure according to claim 7, wherein a combined thickness of the first and second substrates of the baffle board is greater than a combined thickness of the interior and exterior substrates of said plurality of walls.

11. A loudspeaker having a constrained layer damped enclosure, comprising:

- a baffle board and a plurality of transducers mounted to said baffle board;
- a plurality of walls connected to said baffle board which together with said baffle board define an enclosure;
- a plurality of internal braces extending between said baffle board and said walls for stiffening the walls of the enclosure to increase a resonance frequency of the enclosure;
- said baffle board comprising a constrained layer damping arrangement having a first substrate, a second substrate, and a layer of isolation material sandwiched between and bonded to said first and second substrates;
- wherein said isolation material comprises an energy absorbing thermoplastic alloy having a high material loss factor.

12. The loudspeaker according to claim 11, wherein the layer of isolation material has a thickness in the range of 3.2 mm to 6.4 mm.

13. The loudspeaker according to claim 11, further comprising a gasket sandwiched between a mounting frame of said transducer and an exterior surface of said baffle board for providing an airtight seal between the transducer and the baffle board.

14. The loudspeaker according to claim 11, further comprising a layer of extensional damping material bonded to said first substrate on an interior side of said baffle board.

15. The loudspeaker according to claim 11, wherein said plurality of walls each comprises an interior substrate, an exterior substrate, and a layer of isolation material sandwiched between and bonded to said interior and exterior substrates.

16. The loudspeaker according to claim 15, wherein the isolation material in said plurality of walls comprises an energy absorbing thermoplastic alloy having a high material loss factor.

17. The loudspeaker according to claim 15, further comprising a layer of extensional damping material bonded to said interior substrate on an interior side of each of said plurality of walls.

18. The loudspeaker according to claim 15, wherein a combined thickness of the first and second substrates of the baffle board is greater than a combined thickness of the interior and exterior substrates of said plurality of walls.

19. A loudspeaker having a constrained layer damped enclosure, comprising:

- a baffle board and a plurality of transducers mounted to said baffle board;
- a plurality of walls connected to said baffle board which together with said baffle board define an enclosure;
- said baffle board comprising a constrained layer damping arrangement having a first substrate, a second substrate, and a first layer of isolation material sandwiched between and bonded to said first and second substrates, said first layer of isolation material comprising an energy absorbing thermoplastic alloy having a high material loss factor and a thickness in the range of 3.2 mm to 6.4 mm;
- said plurality of walls each comprises an interior substrate, an exterior substrate, and a second layer of isolation material sandwiched between and bonded to said interior and exterior substrates, said second layer of isolation material comprising an energy absorbing thermoplastic alloy having a high material loss factor;
- a combined thickness of the first and second substrates of the baffle board being greater than a combined thickness of the interior and exterior substrates of said plurality of walls; and
- further comprising a first layer of extensional damping material bonded to said first substrate on an interior side of said baffle board, and a second layer of extensional damping material bonded to said interior substrate on an interior side of each of said plurality of walls.

* * * * *